(12) United States Patent
Chiu et al.

(10) Patent No.: US 10,432,200 B1
(45) Date of Patent: Oct. 1, 2019

(54) GALLIUM ARSENIDE CELL AND LOGIC CIRCUIT

(71) Applicant: WIN Semiconductors Corp., Tao Yuan (TW)

(72) Inventors: Jui-Chieh Chiu, Taoyuan (TW); Chih-Wen Huang, Taoyuan (TW); Shao-Cheng Hsiao, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 16/192,700

(22) Filed: Nov. 15, 2018

(51) Int. Cl.
| | | |
|---|---|---|
| H01L 29/06 | (2006.01) | |
| H01L 29/20 | (2006.01) | |
| H01L 21/02 | (2006.01) | |
| H03K 19/094 | (2006.01) | |
| H01L 29/205 | (2006.01) | |
| H01L 21/683 | (2006.01) | |
| H01L 21/311 | (2006.01) | |

(52) U.S. Cl.
CPC ....... *H03K 19/094* (2013.01); *H01L 21/0254* (2013.01); *H01L 21/02458* (2013.01); *H01L 21/311* (2013.01); *H01L 21/6835* (2013.01); *H01L 29/0696* (2013.01); *H01L 29/20* (2013.01); *H01L 29/205* (2013.01)

(58) Field of Classification Search
CPC ............. H01L 29/41758; H01L 27/088; H01L 29/42316; H01L 29/4238; H01L 29/78; H01L 29/772; H01L 21/02546; H01L 27/0688; H01L 27/10; H01L 27/12; H01L 29/20; H01L 29/0696; H03K 19/094
See application file for complete search history.

(56) References Cited

U.S. PATENT DOCUMENTS

| | | | | | |
|---|---|---|---|---|---|
| 4,609,889 | A * | 9/1986 | Kumar | .................... | H03H 11/36 257/270 |
| 4,965,863 | A * | 10/1990 | Cray | .................... | H01L 27/0605 257/E27.012 |
| 6,232,840 | B1 * | 5/2001 | Teeter | ..................... | H03F 1/083 257/533 |
| 7,173,292 | B2 * | 2/2007 | Phillips | ............... | H01L 29/1029 257/194 |
| 8,631,383 | B2 * | 1/2014 | Wagner | ............... | G06F 17/5068 716/138 |
| 9,412,730 | B2 * | 8/2016 | Wagner | ............... | G06F 17/5068 |
| 2012/0306022 | A1 * | 12/2012 | Chuan | ................. | H01L 27/0207 257/390 |

* cited by examiner

*Primary Examiner* — Vibol Tan
(74) *Attorney, Agent, or Firm* — Winston Hsu (57) ABSTRACT

A GaAs (Gallium Arsenide) cell is provided. The GaAs cell comprises a drain electrode and a source electrode, disposed on the GaAs substrate; a plurality of gate electrodes, disposed between the drain electrode and the source electrode, elongated on a first direction, wherein a gate electrode among the plurality of gate electrodes comprises a first end and a second end; a plurality of first anchors; a plurality of second anchors; wherein a first gate electrode and a second gate electrode among the plurality of gate electrodes are spaced by a gate-to-gate spacing, the first gate electrode and the drain electrode are spaced by a first gate-to-terminal spacing, and the gate-to-gate spacing is smaller than twice of the first gate-to-terminal spacing.

20 Claims, 8 Drawing Sheets

GALLIUM ARSENIDE CELL AND LOGIC CIRCUIT

BACKGROUND OF THE INVENTION

1. Field of the Invention

The present invention relates to a GaAs (Gallium Arsenide) cell, and more particularly, to a GaAs cell capable of applying in GaAs logic circuit and reducing circuit area of the GaAs logic circuit.

2. Description of the Prior Art

GaAs (Gallium Arsenide) device has been widely used in MMIC (Monolithic Microwave Integrated Circuit), IR LED (Infrared Ray Light Emitting Diode), FEM (Front End Module), etc. Recently, some simple logic functions have been integrated in GaAs chips. For logic circuits, reducing the circuit area is always an important issue.

On the other hand, as the technology of manufacturing GaAs semiconductor evolves, gate electrodes for HEMT (High Electron Mobility Transistor) may be thin. Since the gate electrode within the HEMT is formed by etching, anchors are included in the HEMT to enhance the stability of the gate electrode. By including the anchors, an area of the GaAs logic circuit is enlarged.

Therefore, how to reduce circuit area for GaAs logic circuit is a significant objective in the field.

SUMMARY OF THE INVENTION

It is therefore a primary objective of the present invention to provide a GaAs cell capable of applying in GaAs (Gallium Arsenide) logic circuit and reducing circuit area of the GaAs logic circuit, to improve over disadvantages of the prior art.

An embodiment of the present invention discloses a GaAs (Gallium Arsenide) cell comprising a GaAs substrate; a drain electrode and a source electrode, disposed on the GaAs substrate; a plurality of gate electrodes, disposed between the drain electrode and the source electrode, elongated on a first direction, wherein a gate electrode among the plurality of gate electrodes comprises a first end and a second end; a plurality of first anchors, wherein a first anchor among the plurality of first anchors is disposed at a first end of the gate electrode; a plurality of second anchors, wherein a second anchor among the plurality of second anchors is disposed at a second end of the gate electrode; wherein a first gate electrode and a second gate electrode among the plurality of gate electrodes are spaced by a gate-to-gate spacing, the first gate electrode and the drain electrode are spaced by a first gate-to-terminal spacing, and the gate-to-gate spacing is smaller than twice of the first gate-to-terminal spacing.

An embodiment of the present invention discloses a logic circuit, comprising a GaAs (Gallium Arsenide) cell, comprising a GaAs substrate; a drain electrode and a source electrode, disposed on the GaAs substrate; a plurality of gate electrodes, disposed between the drain electrode and the source electrode, wherein a gate electrode among the plurality of gate electrodes comprises a first end and a second end; a plurality of first anchors, wherein a first anchor among the plurality of first anchors is disposed at a first end of the gate electrode; a plurality of second anchors, wherein a second anchor among the plurality of second anchors is disposed at a second end of the gate electrode; wherein a first gate electrode and a second gate electrode among the plurality of gate electrodes are spaced by a gate-to-gate spacing, the first gate electrode and the drain electrode are spaced by a first gate-to-terminal spacing, and the gate-to-gate spacing is smaller than twice of the first gate-to-terminal spacing; a load circuit, comprising a first terminal and a second terminal, wherein the first terminal receives a positive voltage and the second terminal is connected to the drain electrode. The load circuit and the GaAs cell form a logic circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
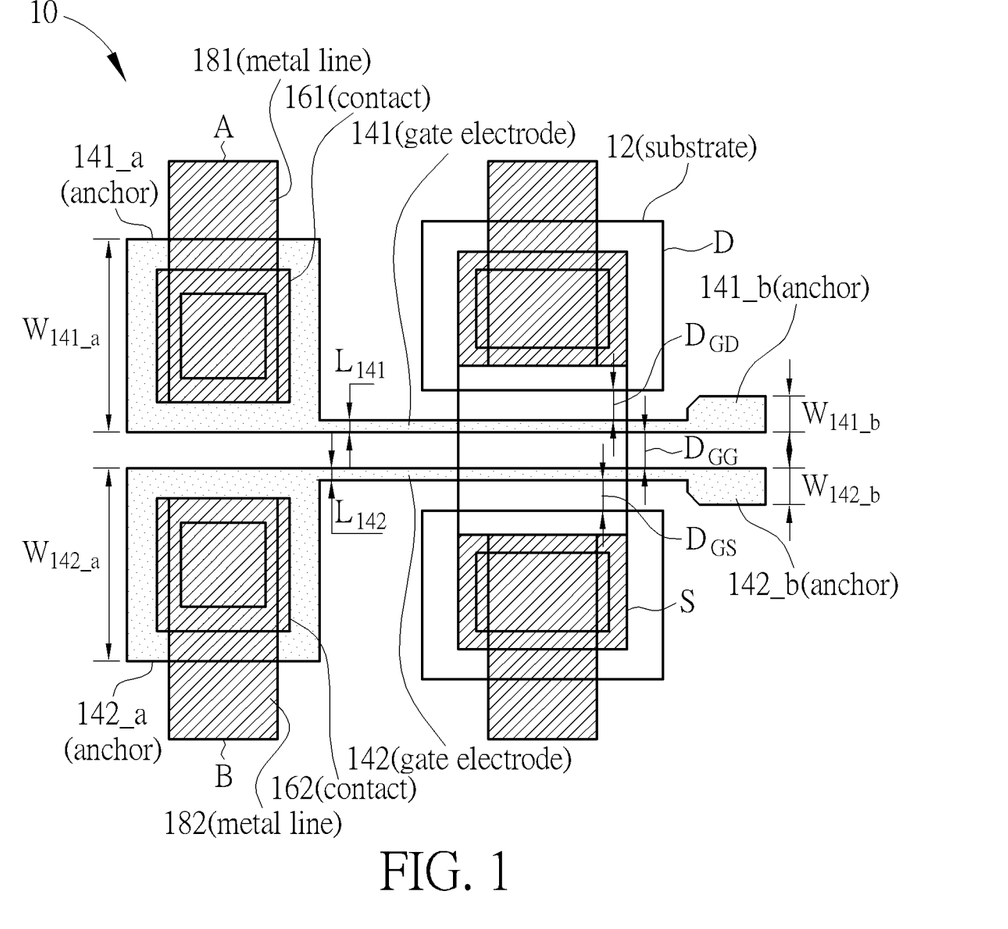
FIG. 1 is a schematic layout diagram of a GaAs (Gallium Arsenide) cell according to an embodiment of the present invention.
Figure 2:
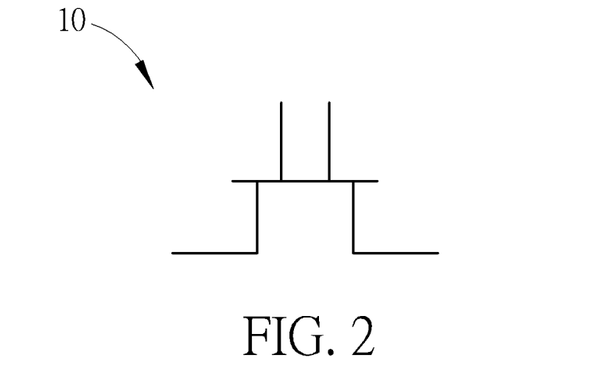
FIG. 2 is a schematic circuit diagram of the GaAs cell of FIG.

Please refer to FIG. 1 and FIG. 2. FIG. 1 is a schematic layout diagram of a GaAs (Gallium Arsenide) cell 10 according to an embodiment of the present invention. FIG. 2 is a schematic circuit diagram of the GaAs cell 10. The GaAs cell 10 comprises a GaAs substrate 12, a drain electrode D, a source electrode S, gate electrodes 141, 142, and anchors 141_a, 141_b, 142_a, 142_b. Different from CMOS manufacturing process, the thin gate electrode 141, 142 is formed by etching, which is fragile. To prevent the gate electrode from fracturing, the GaAs cell 10 further comprises a anchors 141_a, 141_b, 142_a, 142_b, disposed at two ends of the gate electrodes 141,142. That is, the first anchor 141_a is at a first end of the gate electrode 141 and the second anchor 141_b is at a second end (of the gate electrode 141); the first anchor 142_a is at a first end of the gate electrode 142 and the second anchor 142_b is at a second end (of the gate electrode 142). The drain electrode D and the source electrode S are disposed on the GaAs substrate 12. The gate electrodes 141, 142 are disposed between the drain electrode D and the source electrode S (in a top view perspective). The gate electrodes 141, 142 are elongated along a horizontal direction of FIG. 1. The cell 10 forms a transistor with two gates. Contacts 161, 162 are formed on the anchors 141_a, 142_a, respectively, and the anchors 141_a, 142_a may be coupled to metal lines 181, 182 through the contacts 161, 162, respectively, to receive corresponding gate signals A, B.

The gate electrodes 141, 142 have gate lengths $L_{141}$, $L_{142}$ (on/along a vertical direction) of FIG. 1, respectively. The anchors 141_a, 142_a, 141_b, 142_b have widths $W_{141\_a}$, $W_{142\_a}$, $W_{141\_b}$, $W_{142\_b}$ on/along the vertical direction of FIG. 1, respectively. The gate lengths $L_{141}$, $L_{142}$ are smaller than the widths $W_{141\_a}$, $W_{142\_a}$, $W_{141\_b}$, $W_{142\_b}$. In an embodiment, the gate lengths $L_{141}$, $L_{142}$ are less than or equal to 0.5 µm. The widths $W_{141\_a}$, $W_{142\_a}$, $W_{141\_b}$, $W_{142\_b}$ may be equal to or larger than 1 µm. For example, the widths $W_{141\_a}$, $W_{142\_a}$ may be 6 µm, and the widths $W_{141\_b}$, $W_{142\_b}$ may be larger than 1.5 µm and less than 2 µm.

The gate electrode 141 and the gate electrode 142 are spaced by a gate-to-gate spacing $D_{GG}$. The gate electrode 141 and the drain electrode D are spaced by a gate-to-terminal spacing $D_{GD}$. The gate electrode 142 and the source electrode S are spaced by a gate-to-terminal spacing $D_{GS}$. The gate-to-gate spacing $D_{GG}$ is smaller than twice of the gate-to-terminal spacing $D_{GD}$, i.e., $D_{GG}<2*D_{GD}$. In another perspective, the gate-to-gate spacing $D_{GG}$ is also smaller than twice of the gate-to-terminal spacing $D_{GS}$, i.e., $D_{GG}<2*D_{GS}$. Specifically, the gate-to-gate spacing $D_{GG}$ is between 0.7 µm and 1 µm, i.e., $0.7\ \mu m \leq D_{GG} \leq 1\ \mu m$.

In practice, the gate-to-gate spacing $D_{GG}$ cannot be too large. If the gate-to-gate spacing $D_{GG}$ is large, an equivalent resistance between the two gate electrode would be induced. If the gate-to-gate spacing $D_{GG}$ is larger than 1 µm, the equivalent resistance between the two gate electrode would be noticeable. The high equivalent resistance between the two gate electrodes would degrade the functionality of the transistor formed by the GaAs cell 10. In an ideal situation, there should be no equivalent resistance between the two gate electrodes.

On the other hand, due to the limitation of optical process in semiconductor, the gate-to-gate spacing $D_{GG}$ cannot be too small. If the gate-to-gate spacing $D_{GG}$ is too small, e.g., smaller than 0.7 µm, a voltage leakage would be induced between the two gate electrode. That is, a voltage applied to one gate electrode would affect another gate electrode, and thus, the functionality of the transistor formed by the GaAs cell 10 would also be degraded. In an ideal situation, there should be no voltage leakage between the two gate electrodes, which means that, the voltage applied to one gate electrode should not produce any effect on another gate electrode.

Figure 3:
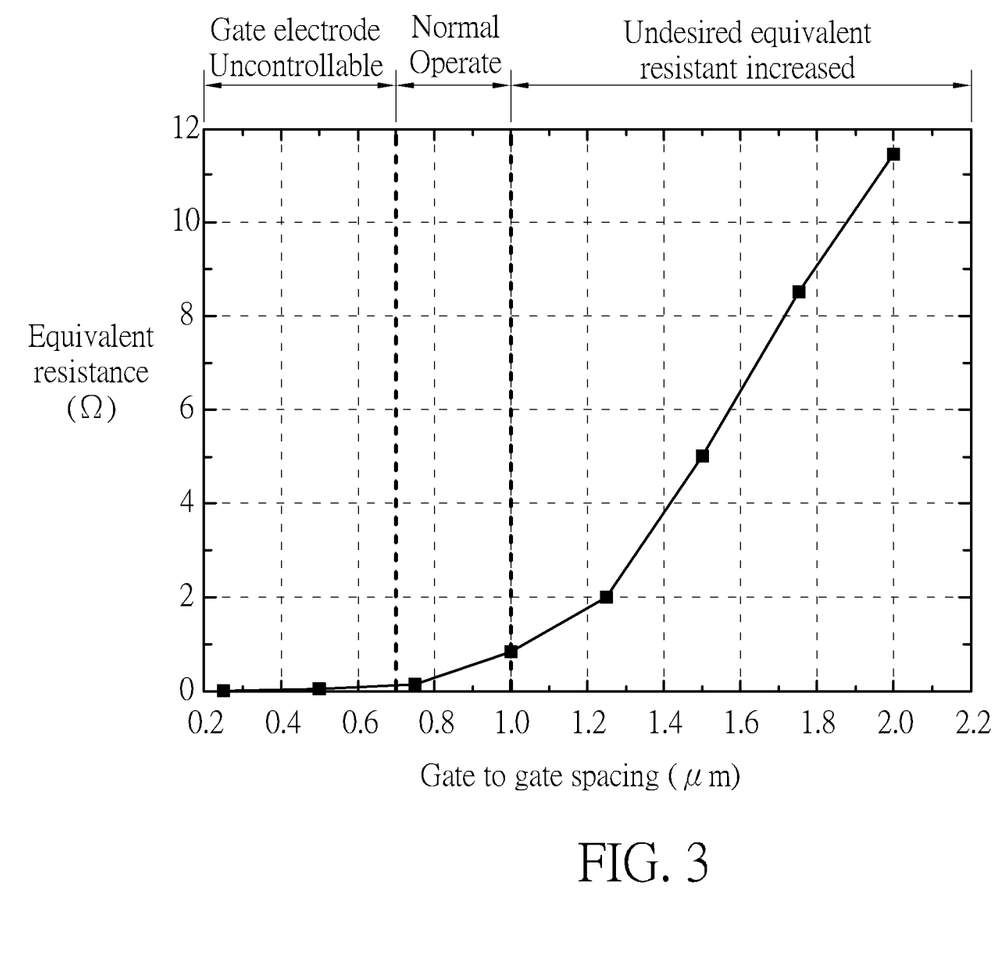
FIG. 3 is a curve of gate-to-gate spacing versus equivalent resistance.

Referring to FIG. 3, in which a curve of gate-to-gate spacing versus equivalent resistance is shown. As can be seen from FIG. 3, when the gate-to-gate spacing $D_{GG}$ is larger than 1 µm, the equivalent resistance would be larger than 0.8 KΩ, which is unacceptable if the GaAs cell is applied in a logic circuit. On the other hand, when the gate-to-gate spacing $D_{GG}$ is less than 0.7 µm, the voltage leakage induced would cause the gate voltages being uncontrollable. When the gate-to-gate spacing $D_{GG}$ is greater than 0.7 µm and less than 1 µm, the transistor formed by the GaAs cell 10 functions normally.

Figure 4:
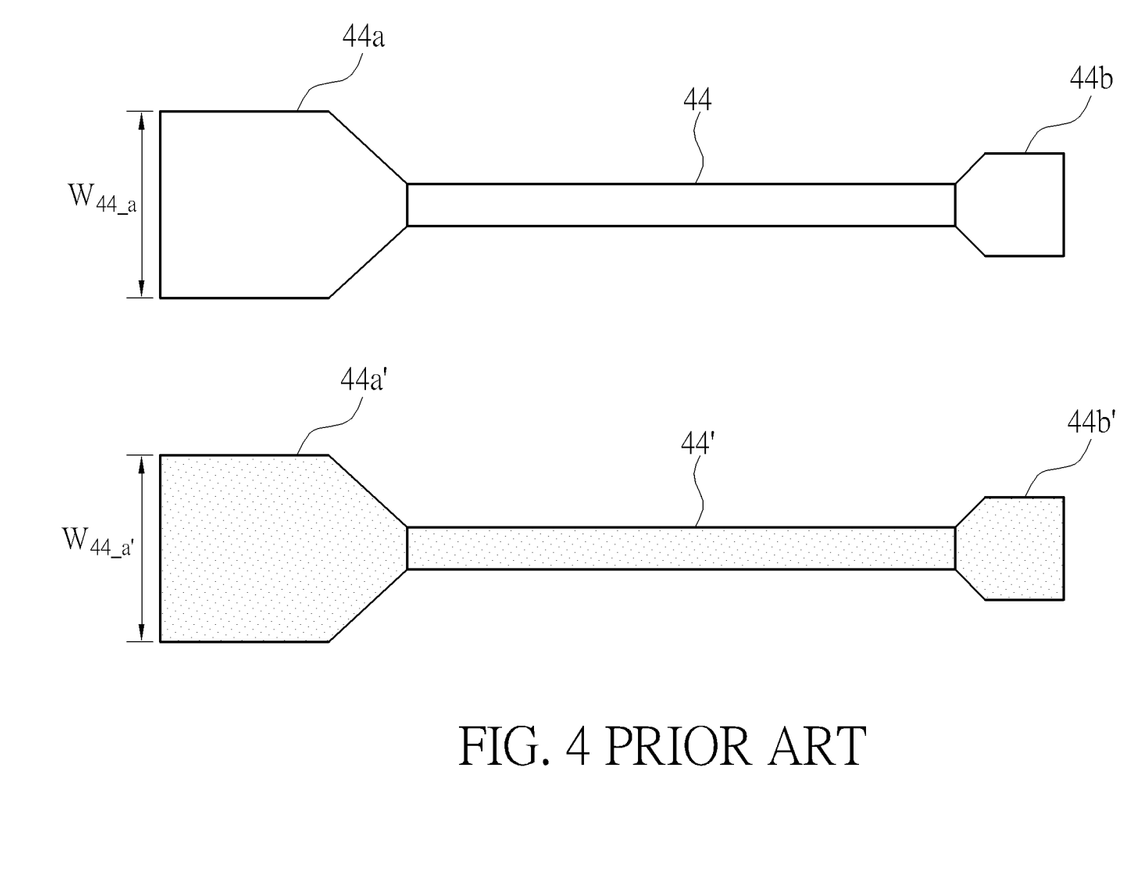
FIG. 4 is a schematic layout diagram of a GaAs cell in the art.

However, an anchor connected to a gate electrode is usually symmetric with respect to the gate electrode. Referring to FIG. 4, in which two gate electrodes 44, 44' and their corresponding anchors 44a, 44b, 44a', 44b' are illustrated. The anchors 44a, 44b are symmetric with respect to the gate electrode 44. The anchors 44a', 44b' are symmetric with respect to the gate electrode 44'. If the symmetry of the anchors 44a, 44b, 44a', 44b' is remained, given a width $W_{44a}$ of the anchors 44a and a width $W_{44a'}$ of the anchors 44a' may, for example, be 5 or 6 µm, it is impossible for the gate-to-gate spacing to be less than or equal to 1 µm.

To achieve the gate-to-gate spacing $D_{GG}$ to be less than 1 µm, the anchors 141_a, 142_a, 141_b, 142_b may be arranged. As can be seen from FIG. 1, a side of the anchor 141_a and a side of the anchor 141_b are aligned to/with a side of the gate electrode 141, and a side of the anchor 142_a and a side of the anchor 142_b are aligned to/with a side of the gate electrode 142. That is, the side of the anchor 141_a, the side of gate electrode 141 and the side of the anchor 141_b are aligned as a straight line, in the top view perspective. Similarly, the side of the anchor 142_a, the side of gate electrode 142 and the side of the anchor 142_b are aligned as a straight line, in the top view perspective. Therefore, the gate-to-gate spacing $D_{GG}$ is able to be less than or equal to 1 µm.

Figure 5:
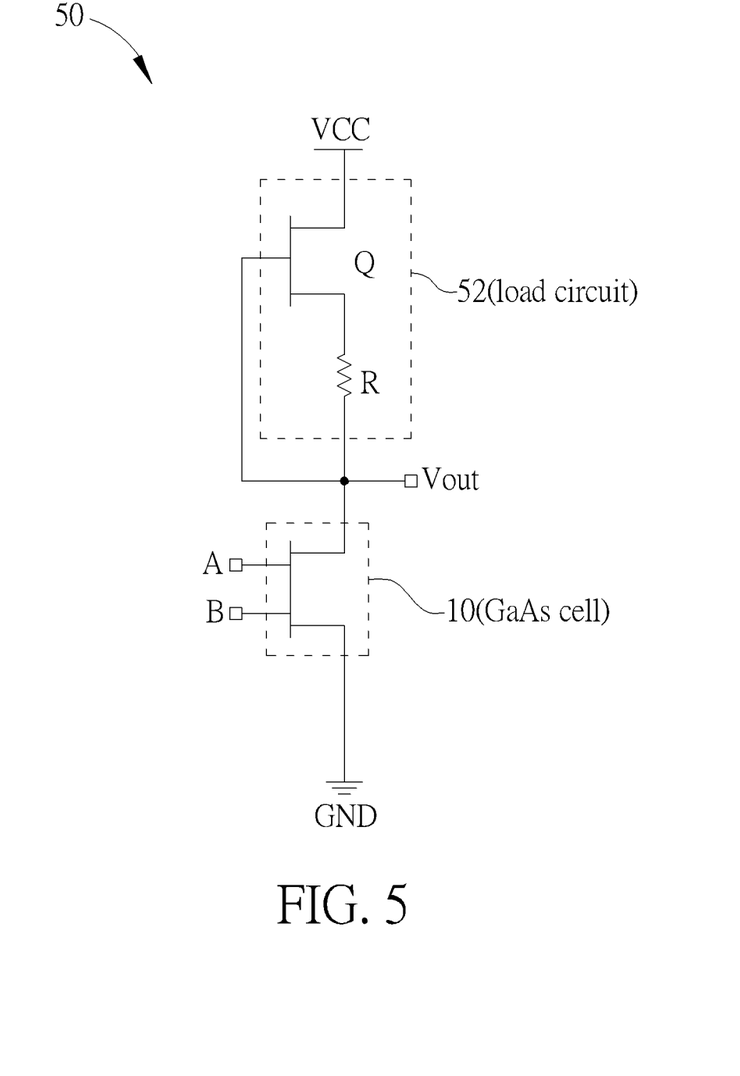
FIG. 5 is a schematic circuit diagram of a logic circuit according to an embodiment of the present invention.
Figure 6:
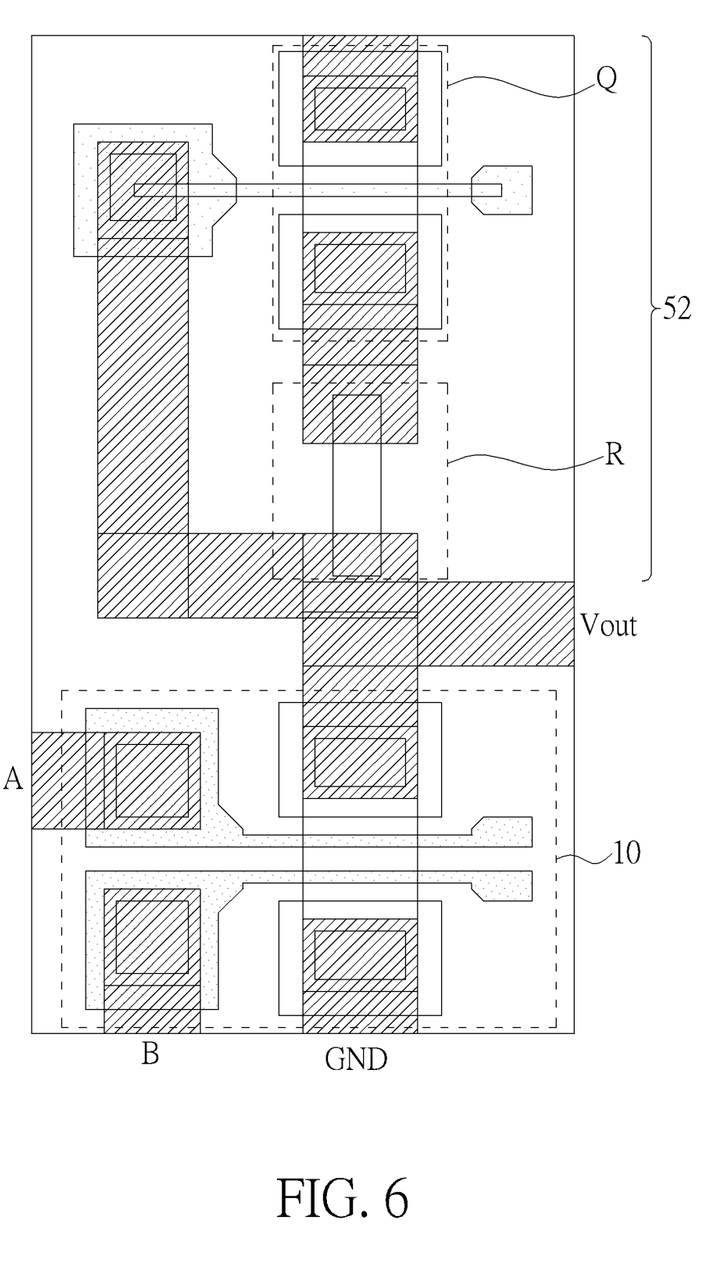
FIG. 6 is a schematic layout diagram of the logic circuit of FIG. 5.

The GaAs cell 10 may be applied in a logic cell. Please refer to FIG. 5 and FIG. 6. FIG. 5 is a schematic circuit diagram of a logic circuit 50 according to an embodiment of the present invention. FIG. 6 is a schematic layout diagram of the logic circuit 50. The logic circuit 50 is a realization of a NAND gate performing a logic NAND function, i.e., the output voltage Vout can be expressed as Vout=A NAND B. The logic circuit 50 comprises the GaAs cell 10 and a load circuit 52. A terminal of the load circuit 52 is connected to the drain electrode D of the GaAs cell 10, and another terminal of the load circuit 52 receives a positive voltage VCC. The load circuit 52 comprises a transistor Q and a resistor R. The resistor R may be a thin-film resistor (TFR) or a hi-tech resistor (HTR).

In the logic circuit 50, when the gate signals A and B are logic high, meaning that the transistor formed by the GaAs cell 10 is conducted, the output voltage Vout should be 0V as a ground voltage ideally. In an experiment, in which the gate-to-gate spacing $D_{GG}$ is set to be 2 µm, larger than 1 µm, under a condition that the gate signals A and B are logic high (as more or less 1 V), the output voltage Vout is 0.8 V, which is not sufficiently low. Hence, the logic circuit 50 does not function well when the gate-to-gate spacing $D_{GG}$ is 2 µm. In an embodiment, the gate-to-gate spacing $D_{GG}$ is set to be 1 µm. Under a condition that the gate signals A and B are logic high (as more or less 1 V), the output voltage Vout approaches 0 V. Hence, the logic circuit 50 functions normally when gate-to-gate spacing $D_{GG}$ is 1 µm.

Figure 7:
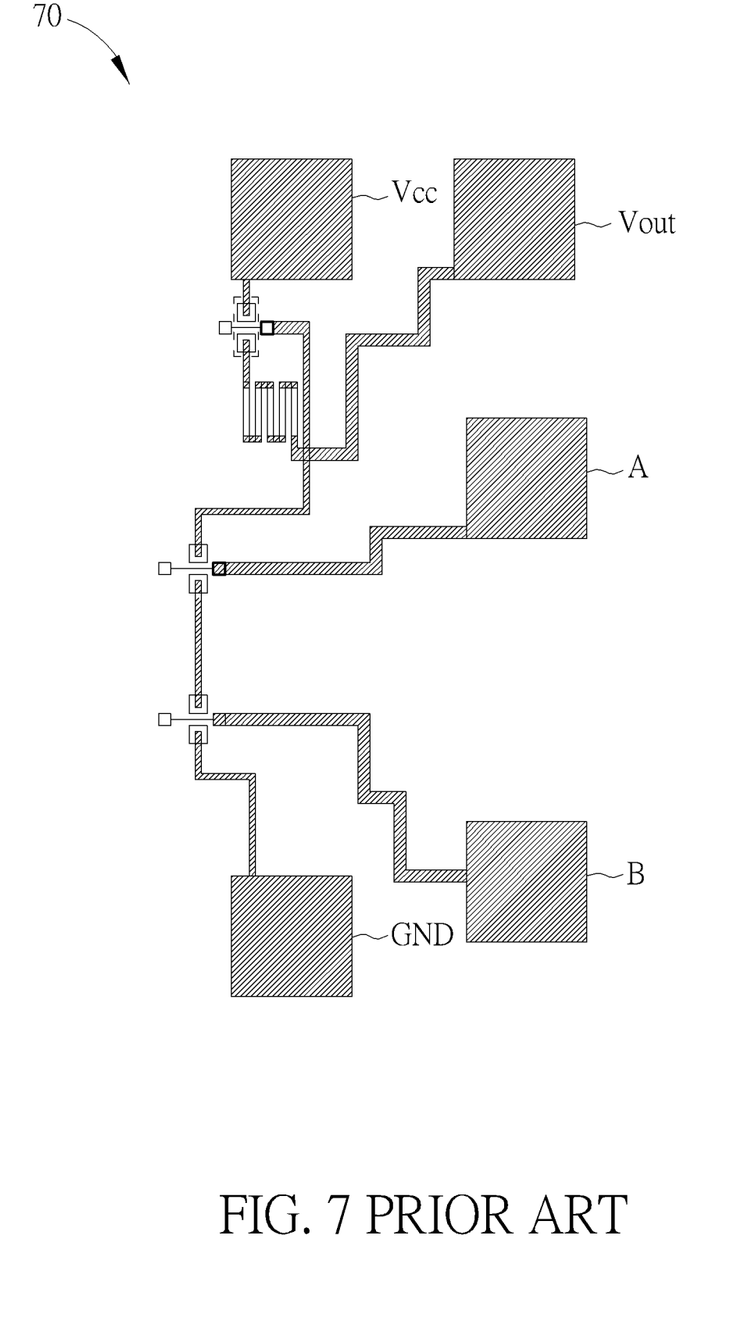
FIG. 7 is a schematic layout diagram of a logic circuit in the art.

The GaAs cell 10 forming one transistor with two gates reduces circuit area. Please refer to FIG. 7. FIG. 7 is a schematic layout diagram of a logic circuit 70 in the art. The logic circuit 70 realizes the same logic function as the logic circuit 50, which is the NAND gate. Compared to the logic circuit 50, the logic circuit 70 requires two single gate transistors and occupies large circuit area. On the contrary, the GaAs cell 10 within the logic circuit 50 forms one transistor with two gates. Thereby, the circuit area of the logic circuit 50 is reduced by utilizing the GaAs cell 10, especially in a vertical direction in FIG. 7, compared to the logic circuit 70.

Notably, the embodiments stated in the above are utilized for illustrating the concept of the present invention/application. Those skilled in the art may make modifications and alterations accordingly, and not limited herein. For example, the load circuit 52 comprising the transistor Q and the resistor R is an active load, which is not limited therein. The load circuit 52 may comprise simply the transistor Q or simply the resistor R, depending on practical situation.

Figure 8:
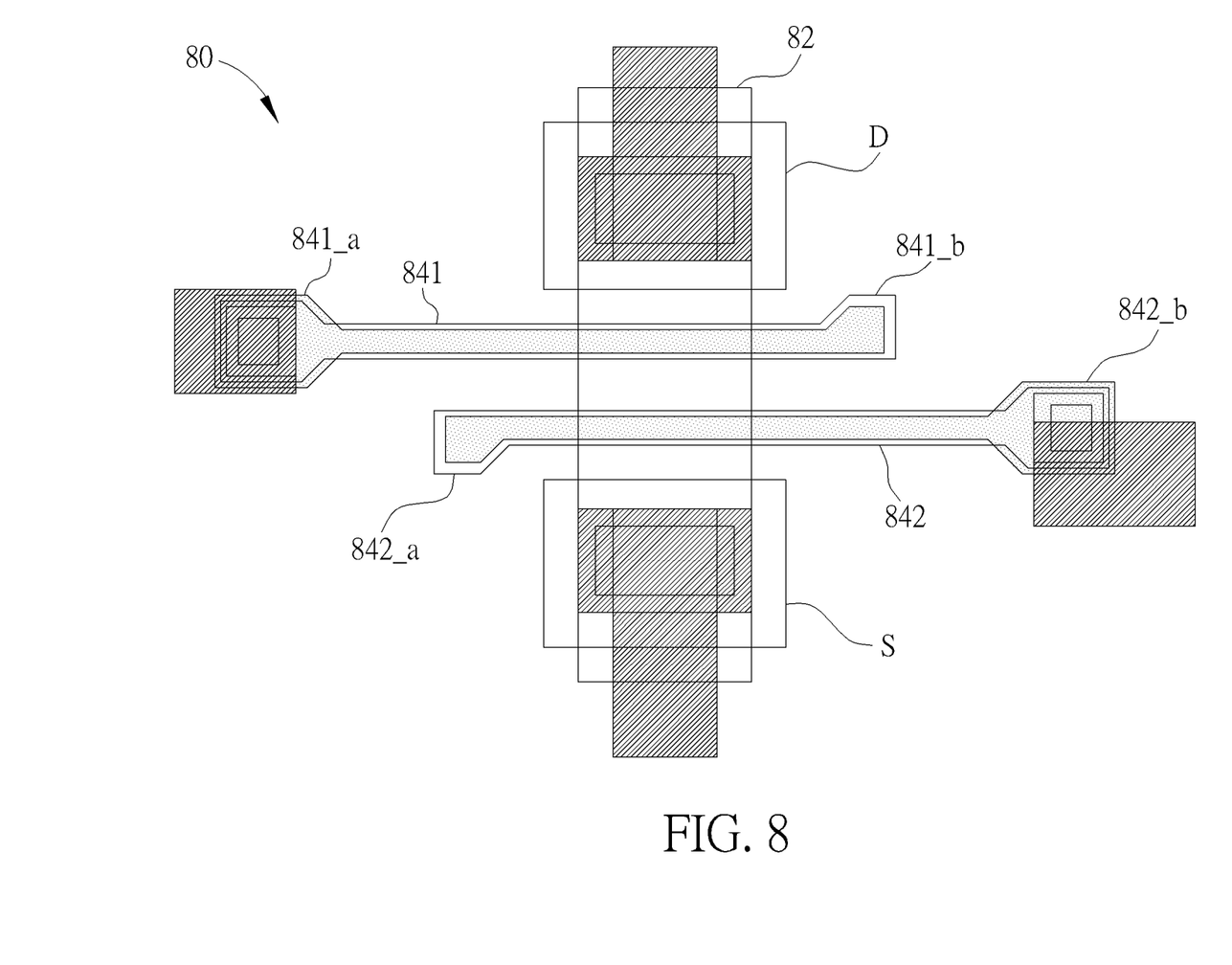
FIG. 8 is a schematic layout diagram of a GaAs cell according to an embodiment of the present invention.

Furthermore, the arrangement of the anchors related to the gate electrodes within the GaAs cell is not limited. For example, please refer to FIG. 8. FIG. 8 is a schematic layout diagram of a GaAs cell 80 according to an embodiment of the present invention. The GaAs cell 80 comprises a GaAs substrate 82, a drain electrode D, a source electrode S, gate electrodes 841, 842, and anchors 841_a, 841_b, 842_a, 842_b. Different from the GaAs cell 10, a width of the anchor 842_b is wider than a width of the anchor 842_a, which is also within the scope of the present invention. In order to maintain the gate-to-gate spacing, a side of the anchor 841_b and a side of the anchor 841 are aligned, and a side of the anchor 842_a and a side of the anchor 842 are aligned. That is, the side of the anchor 841_b and the side of the anchor 841 are aligned as a straight line in the top view perspective, and the side of the anchor 842_a and the side of the anchor 842 are aligned as a straight line in the top view perspective.

Figure 9:
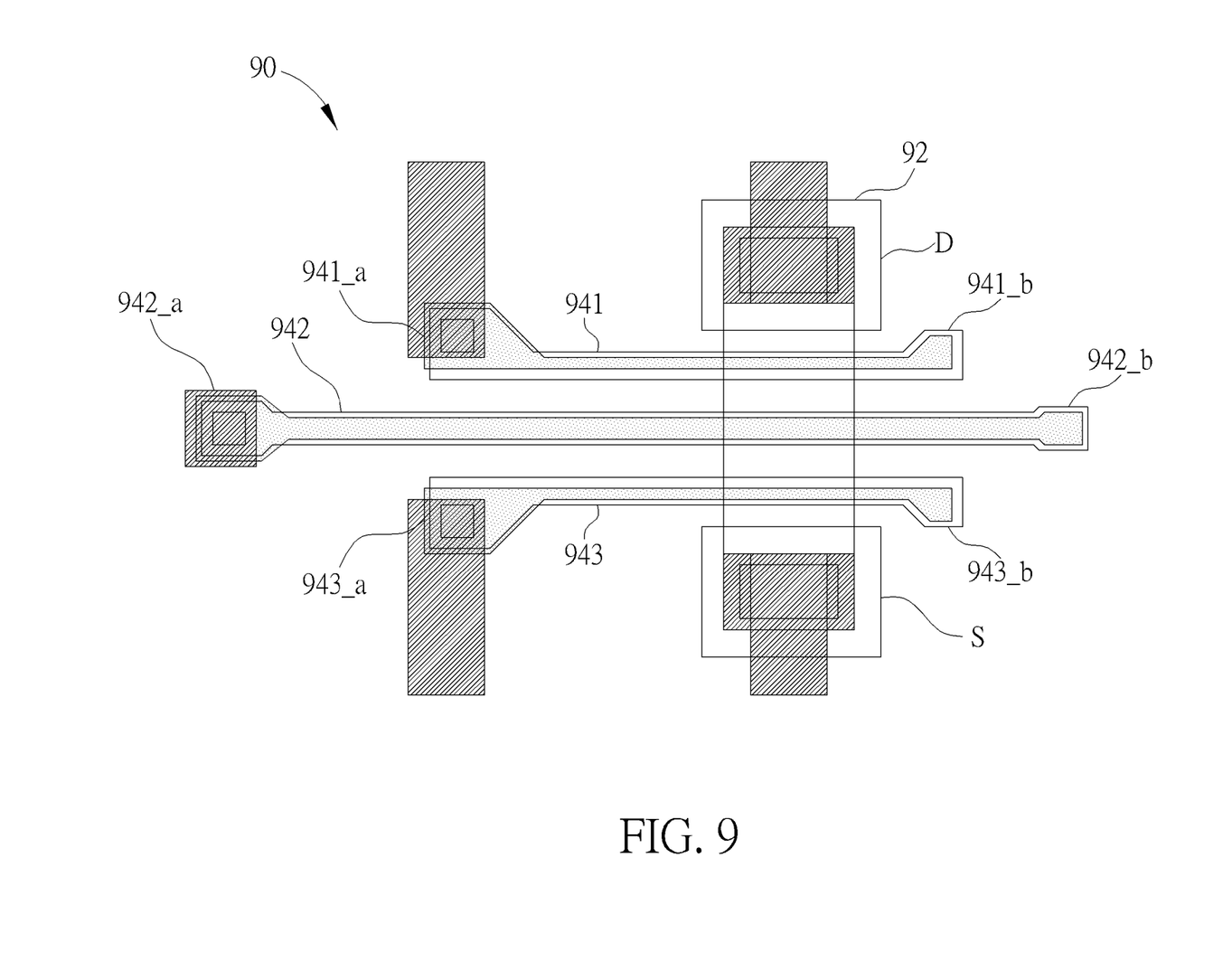
FIG. 9 is a schematic layout diagram of a GaAs cell according to an embodiment of the present invention.

Please refer to FIG. 9. FIG. 9 is a schematic layout diagram of a GaAs cell 90 according to an embodiment of the present invention. The GaAs cell 90 comprises a GaAs substrate 92, the drain electrode D, the source electrode S, and three gate electrodes 941, 942, 943 and anchors 941_a, 941_b, 942_a, 942_b, 943_a and 943_b. In order to maintain the gate-to-gate spacing, sides of the anchors 941_a, 941_b and a side of the anchor 941 are aligned, and sides of the anchors 943_a, 943_b and a side of the anchor 943 are aligned. That is, the sides of the anchors 941_a, 941_b and the side of the anchor 941 are aligned as a straight line in the top view perspective, and the sides of the anchors 943_a, 943_b and the side of the anchor 943 are aligned as a straight line in the top view perspective.

In addition, the GaAs cells 10 and 80 comprise two gate electrodes, which is not limited thereto. The GaAs cell of the present invention may comprise multiple gate electrodes, which is also within the scope of the present invention.

In summary, the present invention provides the GaAs cell forming one transistor with multiple gates to reduce circuit area.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A GaAs (Gallium Arsenide) cell, comprising:
  a GaAs substrate;
  a drain electrode and a source electrode, disposed on the GaAs substrate;
  a plurality of gate electrodes, disposed between the drain electrode and the source electrode, elongated on a first direction, wherein a gate electrode among the plurality of gate electrodes comprises a first end and a second end;
  a plurality of first anchors, wherein a first anchor among the plurality of first anchors is disposed at a first end of the gate electrode; and
  a plurality of second anchors, wherein a second anchor among the plurality of second anchors is disposed at a second end of the gate electrode;
  wherein a first gate electrode and a second gate electrode among the plurality of gate electrodes are spaced by a gate-to-gate spacing, the first gate electrode and the drain electrode are spaced by a first gate-to-terminal spacing, and the gate-to-gate spacing is smaller than twice of the first gate-to-terminal spacing.

2. The GaAs cell of claim 1, wherein the second gate electrode and the source electrode are spaced by a second gate-to-terminal spacing, and the gate-to-gate spacing is smaller than twice of the second gate-to-terminal spacing.

3. The GaAs cell of claim 1, wherein a side of the gate electrode is aligned with a side of the first anchor corresponding to the gate electrode.

4. The GaAs cell of claim 1, wherein a gate length of the gate electrode on a second direction is smaller than both a first width of the first anchor corresponding to the gate electrode and a second width of the second anchor corresponding to the gate electrode along the second direction.

5. The GaAs cell of claim 1, wherein a gate length of the gate electrode on a second direction is less than or equal to 0.5 μm.

6. The GaAs cell of claim 1, wherein the gate-to-gate spacing is between 0.7 μm and 1 μm.

7. The GaAs cell of claim 1, wherein the second anchor among the plurality of second anchors is coupled to a metal line through a contact, to receive a gate signal.

8. The CaAs cell of claim 1, wherein a first side of the first anchor, a second side of the second anchor and a side of the gate electrode are aligned.

9. A logic circuit, comprising:
  a GaAs (Gallium Arsenide) cell, comprising:
    a GaAs substrate;
    a drain electrode and a source electrode, disposed on the GaAs substrate;
    a plurality of gate electrodes, disposed between the drain electrode and the source electrode, wherein a gate electrode among the plurality of gate electrodes comprises a first end and a second end;
    a plurality of first anchors, wherein a first anchor among the plurality of first anchors is disposed at a first end of the gate electrode; and
    a plurality of second anchors, wherein a second anchor among the plurality of second anchors is disposed at a second end of the gate electrode;
    wherein a first gate electrode and a second gate electrode among the plurality of gate electrodes are spaced by a gate-to-gate spacing, the first gate electrode and the drain electrode are spaced by a first gate-to-terminal spacing, and the gate-to-gate spacing is smaller than twice of the first gate-to-terminal spacing; and
  a load circuit, comprising a first terminal and a second terminal, wherein the first terminal receives a positive voltage and the second terminal is connected to the drain electrode.

10. The logic circuit of claim 9, wherein the load circuit comprises a resistor.

11. The logic circuit of claim 10, wherein the resistor is a thin-film resistor (TFR).

12. The logic circuit of claim 10, wherein the resistor is a hi-tech resistor (HTR).

13. The logic circuit of claim 9, wherein the load circuit comprises a transistor.

14. The logic circuit of claim 9, wherein the second gate electrode and the source electrode are spaced by a second gate-to-terminal spacing, and the gate-to-gate spacing is smaller than twice of the second gate-to-terminal spacing.

15. The logic circuit of claim 9, wherein a side of the gate electrode is aligned with a side of the first anchor corresponding to the gate electrode.

16. The logic circuit of claim 9, wherein a gate length of the gate electrode on a second direction is smaller than both a first width of the first anchor corresponding to the gate electrode and a second width of the second anchor corresponding to the gate electrode along the second direction.

17. The logic circuit of claim 9, wherein a gate length of the gate electrode on a second direction is equal to or less than 0.5 μm.

18. The logic circuit of claim 9, wherein the gate-to-gate spacing is between 0.7 μm and 1 μm.

19. The logic circuit of claim 9, wherein the second anchor among the plurality of second anchors is coupled to a metal line through a contact, to receive a gate signal.

20. The logic circuit of claim 9, wherein a first side of the first anchor, a second side of the second anchor and a side of the gate electrode are aligned.

* * * * *